United States Patent
Saxena et al.

(10) Patent No.: US 12,224,023 B2
(45) Date of Patent: Feb. 11, 2025

(54) ONE TIME PROGRAMMABLE (OTP) LOW POWER CIRCUITS AND METHODS FOR PROVIDING BIAS VOLTAGES TO WORDLINES

(71) Applicant: SAMSUNG ELECTRONICS CO., LTD., Suwon-si (KR)

(72) Inventors: Himanshu Saxena, Bangalore (IN); Ankur Gupta, Bangalore (IN); Mukul Agarwal, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 17/979,051

(22) Filed: Nov. 2, 2022

(65) Prior Publication Data
US 2024/0079070 A1    Mar. 7, 2024

(30) Foreign Application Priority Data
Sep. 1, 2022 (IN) .............................. 202241050091

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ......... G11C 17/18; G11C 17/16; G11C 5/145; G11C 5/147
See application file for complete search history.

(56) References Cited

U.S. PATENT DOCUMENTS

| | | | |
|---|---|---|---|
| 6,141,252 A | 10/2000 | Chen | |
| 8,582,390 B2 | 11/2013 | Yu et al. | |
| 10,366,734 B2 | 7/2019 | Schaefer et al. | |
| 10,937,505 B2 | 3/2021 | Guo et al. | |
| 2011/0298280 A1 | 12/2011 | Homol et al. | |
| 2017/0040067 A1* | 2/2017 | Byun | G11C 17/16 |

* cited by examiner

*Primary Examiner* — Xiaochun L Chen
(74) *Attorney, Agent, or Firm* — F. CHAU & ASSOCIATES, LLC

(57) ABSTRACT

Embodiments herein disclose an OTP low power circuit and methods for providing bias voltages using a single regulator. The circuit includes a Bitcell, a diode drop, a charge pump, a combinational logic controller, a program current sink load, and a read current sink load. The Bitcell includes programmable word lines and read lines, and is configured to operate in either a programmable mode or a read mode. The diode drop is configured to provide a second bias voltage to drive the read lines and the single regulator is configured to provide a first bias voltage to drive the WP in the read mode. The charge pump is configured to provide a third bias voltage to drive the WP in the program mode.

14 Claims, 5 Drawing Sheets

ONE TIME PROGRAMMABLE (OTP) LOW POWER CIRCUITS AND METHODS FOR PROVIDING BIAS VOLTAGES TO WORDLINES

CROSS-REFERENCE TO RELATED APPLICATION

This application is based on and claims priority under 35 U.S.C. § 119 to Indian Patent Application No. 202241050091, filed on Sep. 1, 2022, the disclosure of which is incorporated by reference herein in its entirety.

TECHNICAL FIELD

Embodiments disclosed herein relate to One Time Programmable (OTP) used in system on chips (SOCs) and more particularly to One Time Programmable (OTP) low power circuits and methods for providing bias voltages to wordlines.

DISCUSSION OF THE RELATED ART

OTP memory is used to store important parameters of a semiconductor device. Unlike programmable read-only memory (PROM), OTP devices can be programmed after the device is manufactured to increase flexibility. Once they are programmed, the data cannot be changed, but persists after power is removed.

An existing OTP circuit includes at least two regulators for providing bias voltages to wordlines of SOCs. The OTP circuit is used in almost all the SOCs to store security keys, a memory repair information, and the like for varying applications such as mobiles, Internet of Things MT) device, and the like. However, the OTP circuit with two regulators takes more space in a SOCs design and consumes more power. There is a need for a low power OTP circuit to provide bias voltages.

SUMMARY

Embodiments described herein provide One Time Programmable (OTP) low power circuits and methods for providing bias voltages to wordlines.

Accordingly, the embodiments herein provide a method for providing bias voltages to a One Time Programmable (OTP) low power circuit using a single regulator. The method includes determining, by a combinational logic controller, whether the OTP low power circuit is in a read mode or a programmable mode; responsive to the OTP low power circuit being in the read mode, providing, by a combinational logic controller, a first bias voltage to programmable word lines through the single regulator, and a second bias voltage to read lines, wherein the second bias voltage is generated from the single regulator and passed through current-controlled-voltage drop; and responsive to the OTP low power circuit being in the programmable mode, providing, by the combinational logic controller, a third bias voltage to the programmable word lines from a charge pump, and the first bias voltage to the read lines from the single regulator.

Embodiments herein further disclose the charge pump provides a high programming voltage as the third bias voltage to the programmable read lines.

Embodiments herein further disclose a read cycle of a control signal is high when the OTP low power circuit is in the read mode.

Embodiments herein further disclose a program cycle of the control signal is high when the OTP low power circuit is in the programmable mode.

In an aspect, the embodiments herein provide a One Time Programmable (OTP) low power circuit. The circuit includes a single regulator configured to output a first bias voltage; a Bitcell comprising programmable word lines and read lines, wherein the programmable word lines and the read lines are configured to operate in a programmable mode or a read mode; a diode drop configured to receive the first bias voltage from the single regulator and to provide a second bias voltage to drive: the read lines; a charge pump configured to provide a third bias voltage; a combinational logic controller configured to control operations of the Bitcell in the programmable mode and read mode; a program current sink load configured to drain a load current while the programmable word lines and the read lines are driven by the third bias voltage and the first bias voltage, respectively, in the programmable mode; and a read current sink load that is configured to drain the load current while the programmable word lines and the read lines are driven by the first bias voltage and the second bias voltage, respectively, in the read mode.

In some embodiments, the charge pump provides a high programming voltage as the third bias voltage to the programmable word lines.

In some embodiments, a read cycle of a control signal is high when the OTP low power circuit is in the read mode.

In some embodiments, a program cycle of the control signal is high when the OTP low power circuit is in the programmable mode.

A power circuit includes: a regulator configured to output a first bias voltage; a diode drop configured to receive the first bias voltage and output a second bias voltage; a charge pump configured to output a third bias voltage; a combined logic controller; and a one-time-programmable bit cell comprising a read line and a program line and configured to operate in a read mode or a programmable mode, wherein: when the bit cell is in the read mode, the combined logic controller directs the second bias voltage to the read line and the first bias voltage to the program line, and when the bit cell is in the programmable mode, the combined logic controller directs the first bias voltage to the read line, and the third bias voltage to the program line.

In some embodiments, the power circuit further comprises a plurality of one-time-programmable bit cells, each configured to operate in a read mode or a programmable mode.

In some embodiments, the power circuit includes no more than one regulator.

In some embodiments, the power circuit further comprises a read current sink load and a program current sink load.

In some embodiments, the bit cell is programmed by the third bias voltage through a gate break down process.

These and other aspects of the embodiments herein will be better appreciated and understood when considered in conjunction with the following description and the accompanying drawings. It should be understood, however, that the following descriptions, while indicating at least one embodiment and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

Embodiments of the present disclosure will be more clearly understood from the following detailed description taken in conjunction with the accompanying drawings, in which.

DETAILED DESCRIPTION OF THE EMBODIMENTS

The embodiments herein and the various features and details thereof will now be explained more fully with reference to the embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein can be practiced and to further enable those of skill in the art to practice said embodiments.

Figure 1:
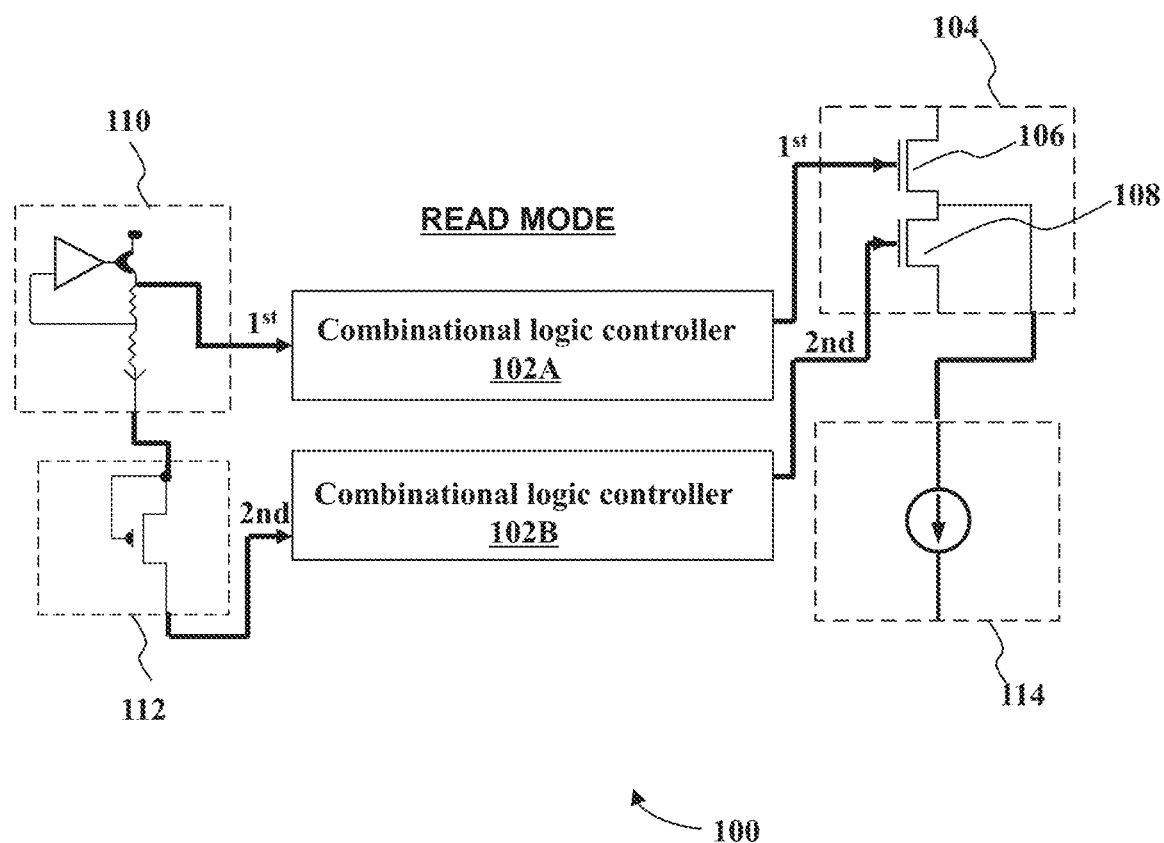
FIG. 1 depicts a One Time Programmable (OTP) low power circuit using a single regulator for a read operation.

The following embodiments achieve One Time Programmable (OTP) low power circuits and methods for providing bias voltages to word lines. FIG. 1 depicts a One Time Programmable (OTP) low power circuit 100 using a single regulator 110 for a read operation, according to embodiments as disclosed herein. The circuit 100 includes a Bitcell 104, a combinational logic controller 102A-102B, a single regulator 110, a diode drop 112, and a read current sink load 114. The Bitcell 104 includes Programmable Word Lines (WP) 106 and Read Word Lines (WR) 108.

In one embodiment, the WP 106 and the WR 108 operate in a Programmable Mode (PGM mode) and in a read mode. For example, the WP 106 and the WR 108 are configured to operate together in either the PGM mode or the read mode. The following description pertains to the components and connections used in the read mode. In the read mode, a lower bias voltage, e.g. from the single regulator 110, is given to the WP 106, and an output from the diode drop 112 is given to the WR 108. In this way, the diode drop 112 is configured to provide a second bias voltage to drive the WR 108, and the single regulator 110 is configured to provide a first bias voltage to drive the WP 106, The read current sink load 114 is configured to drain a load current while the WP and the WR is driven by the bias voltage in the read mode. The first bias voltage is derived from the single regulator 110 using the diode drop 112. The diode drop 112 is used to ensure reliability and prevent a Bitcell leakage current due to high voltage stress. The Bitcell 104 is a memory that includes wordlines such as the WP 106 and the WR 108 to perform operations on SOCs using data or to read data from the memory. Further, the WP 106 and the WR 108 are configured to execute instructions stored in the Bitcell 104 and to perform various processes. For example, the Bitcell 104 is the memory that can store instructions to be executed by a processor.

Figure 2:
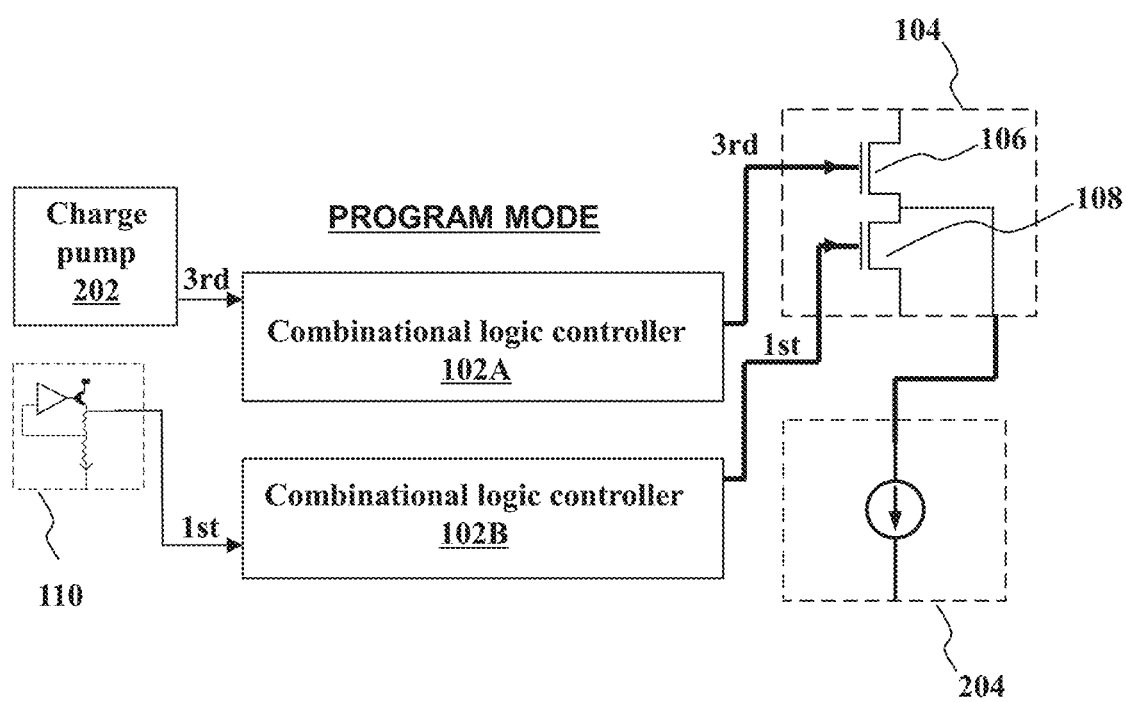
FIG. 2 depicts the OTP low power circuit using the single regulator for a program operation.

Although the FIG. 1 shows various hardware components of the OTP low power circuit 100, it is to be understood that other embodiments are not necessarily limited thereto. In other embodiments, the OTP low power circuit 100 may include fewer or more components. Further, the labels or names of the components are used only for illustrative purposes, and it will be understood that their functionality may be implemented by similar components with different labels. One or more components can be combined together to perform same or substantially similar function in the OTP low power circuit 100, FIG. 2 depicts the OTP low power circuit 100 with the single regulator 110 for a program operation, according to embodiments as disclosed herein. The OTP low power circuit 100 includes a charge pump 202 and a PGM current sink load 204. In the PGM mode, a high voltage (a charge Pump) is given to the WP 106 and the single regulator voltage is given to the WR 108. The charge pump 202 is configured to provide a third bias voltage to drive the WP 106. The single regulator 110 is configured to provide the first bias voltage to drive the WR 108 in the PGM mode. The combinational logic controller 102A-102B is configured to control operations of the Bitcell 104 in the PGM mode and the read mode. For example, the combination logic selects a particular Bitcell based on an address. The PGM current sink load 204 is configured to drain a load current present in the WP 106, when the WP 106 is driven by the bias voltage in the PGM mode.

In some embodiments, the charge pump 202 provides a high programming voltage as the third bias voltage to the WP 106. A read cycle of a control signal is high when the OTP low power circuit 100 is in the read mode. A program cycle of the control signal is high when the OTP low power circuit 100 is in the programmable mode. The WP 106 and WR 108 are biased to ensure successful read operation. The charge pump 202 generates a high programming voltage; for example, the third bias voltage to drive the WP 106 in the program mode.

The single regulator 110 is configured to work in both the read mode and the program mode. The single regulator 110 occupies less space and consumes less power up to 50% compared to the existing OTP circuits. The single regulator 110 is configured to generate multiple bias voltages which helps in reducing area of the SOCs design up to 50%.

Figure 3:
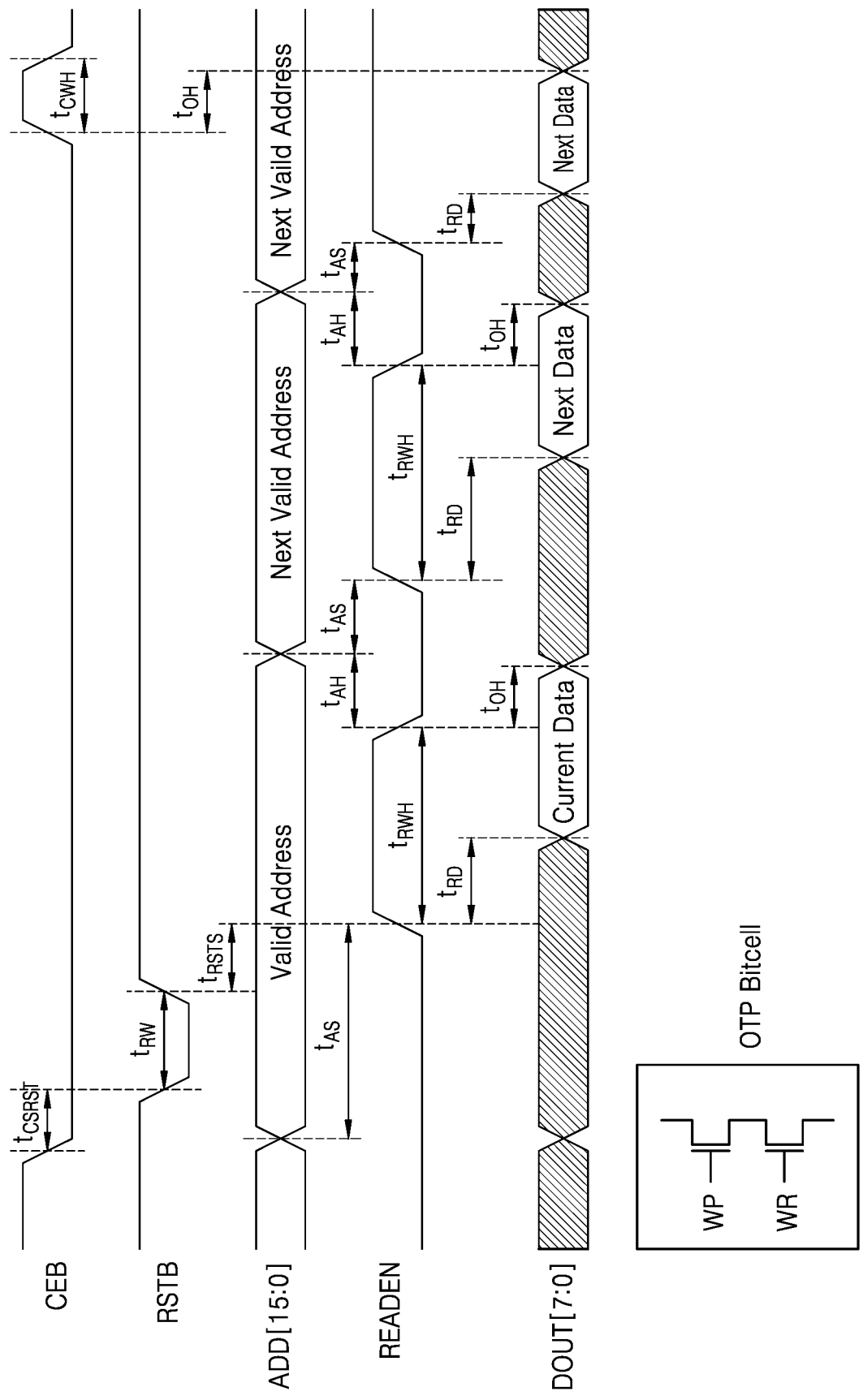
FIG. 3 depicts a first example of a timing diagram of the read operation in the OTP low power circuit.

FIG. 3 depicts a first example of a timing diagram of the read operation in the OTP low power circuit, according to embodiments as disclosed herein. When the single regulator 110 is ON, the WP 106 and the WR 108 are turned ON. When the WP 106 and the WR is 108 ON, a clock enable (CEB) goes low to generate the bias voltages. A valid address is setup before beginning of the read operation. A read cycle start with READEN then becomes a high voltage. The Bitcell 104 is read after $t_{rd}$ delay from READEN.

Figure 4:
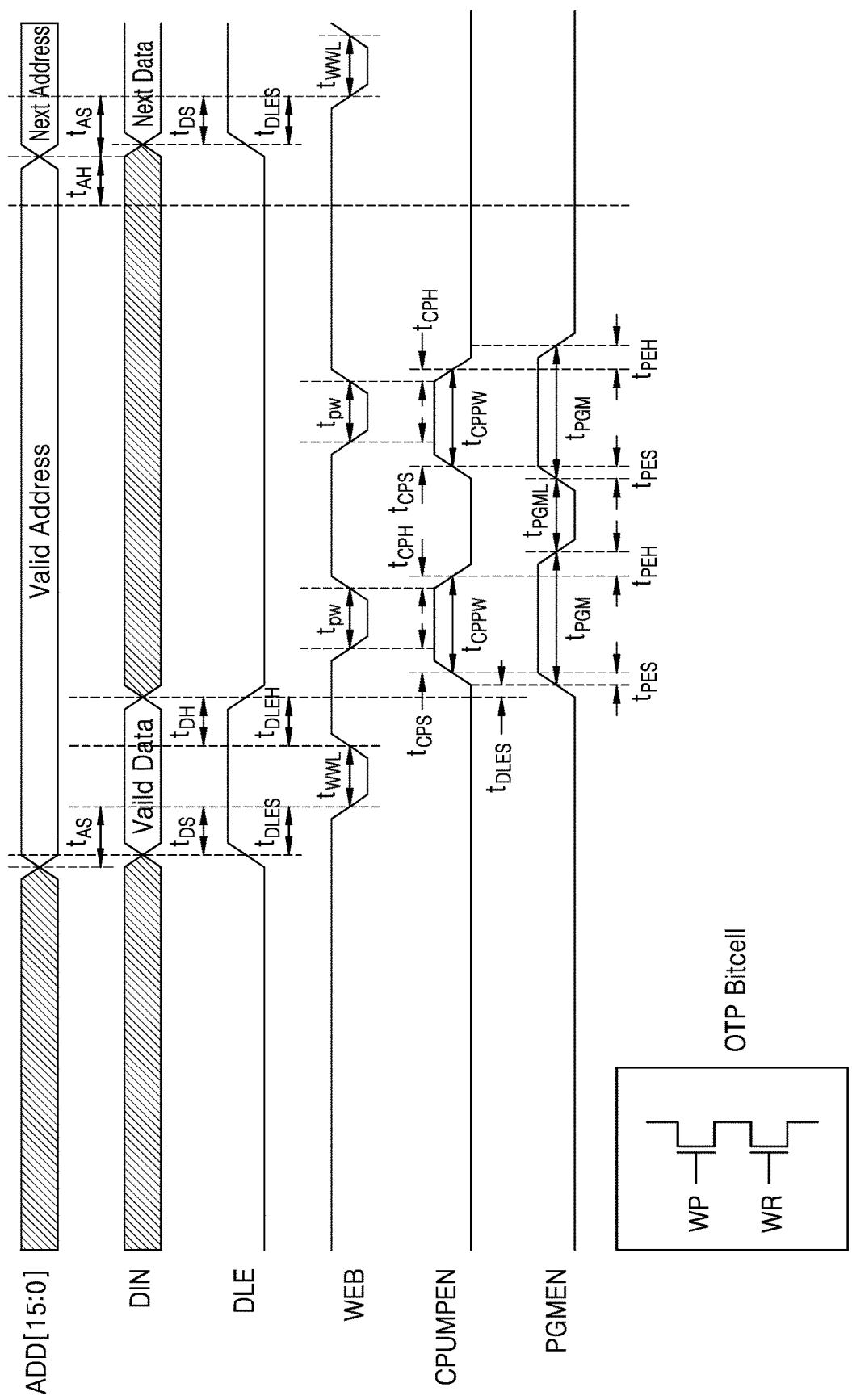
FIG. 4 depicts a second example of a timing diagram of the program operation in the OTP low power circuit.

FIG. 4 depicts a second example of a timing diagram of the program operation in the OTP low power circuit, according to embodiments as disclosed herein. In this example, the valid address and a data are setup before beginning of the program operation. A program cycle starts with PGMEN goes high. The single regulator 110 is disabled for the WP 106 when the PGMEN goes high. The single regulator 110 is enabled for the WR 108 to generate proper bias voltage to ensure reliability of the Bitcell 104. The charge pump 202 turns on in response to a high CPUMPEN voltage to generate high programming voltage to program Bitcell by gate break down. The Bitcell 104 is then programmed during low pulse of WEB.

Figure 5:
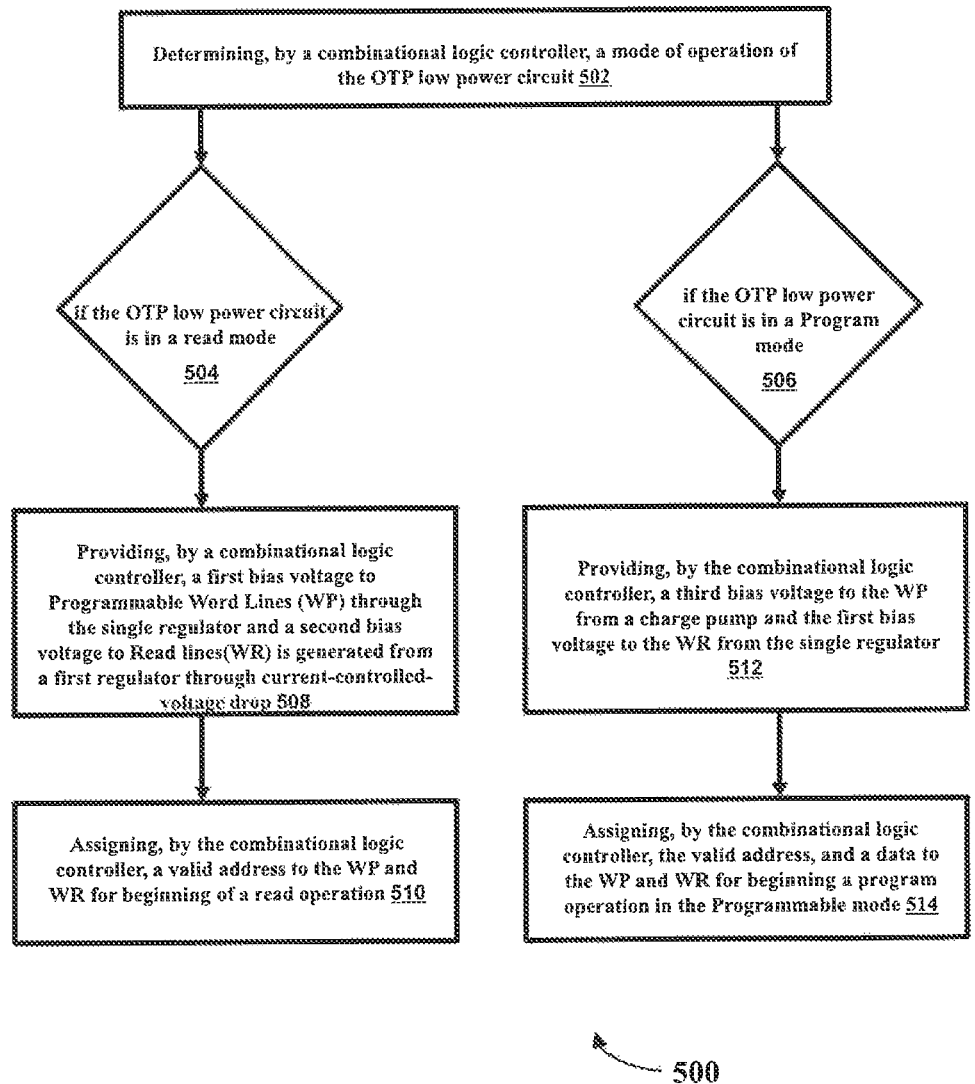
FIG. 5 is a flowchart that illustrates a method of providing bias voltages to the OTP low power circuit using the single regulator.

FIG. 5 depicts a method 500 of providing bias voltages to the OTP low power circuit using the single regulator, according to embodiments as disclosed herein. At step 502, the method 500 includes determining, by the combinational logic controller 102A-102B, a mode of operation of the OTP low power circuit 100. The mode includes at least one of: a read mode and a programmable mode. At step 504, the method 500 determining the OTP low power circuit 100 is in the read mode. At step 508, the method 500 includes providing, by a combinational logic controller 102A-102B, a first bias voltage to the Programmable Word Lines (WP) 106 through the single regulator 110 and a second bias voltage to Read lines WR 108 is generated from the single regulator through current-controlled-voltage drop. At step 510, the method 500 includes assigning, by the combinational logic controller 102A-102B, a valid address to the WR 108 for beginning of the read operation.

At step 506, the method 500 determines the OTP low power circuit 100 is in the programmable mode. At step 512, the method 500 includes providing, by the combinational logic controller 102A-102B, a third bias voltage to the WP 106 from the charge pump 202 and the first bias voltage to the WR 108 from the single regulator 110 At step 514, the method 500 includes assigning, by the combinational logic controller 102A-102B, the valid address and a data to the WP 106 for a program operation in the Programmable mode.

Accordingly, the present disclosure provides embodiments of an OTP circuit with decreased power use. For example, by utilizing a combinational logic controller, embodiments are able to provide bias voltages to wordlines with a single regulator. The embodiments disclosed herein can be implemented through at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of at least one embodiment, those skilled in the art will recognize that the embodiments herein can be practiced with modification within the spirit and scope of the embodiments as described herein.

What is claimed is:

1. A method for providing bias voltages to a one time programmable (OTP) low power circuit using a single regulator, the method comprising:
determining, by a combinational logic controller, whether the OTP low power circuit is in a read mode or a programmable mode;
responsive to the OTP low power circuit being in the read mode, providing, by a combinational logic controller, a first bias voltage to programmable word lines through the single regulator, and a second bias voltage to read lines, wherein the second bias voltage is generated from the single regulator and passed through current-controlled-voltage drop; and
responsive to the OTP low power circuit being in the programmable mode, providing, by the combinational logic controller, a third bias voltage to the programmable word lines from a charge pump, and the first bias voltage to the read lines from the single regulator.

2. The method of claim 1, wherein the charge pump provides a high programming voltage as the third bias voltage to the programmable word lines.

3. The method of claim 1, wherein a read cycle of a control signal is high when the OTP low power circuit is in the read mode.

4. The method of claim 3, wherein a program cycle of the control signal is high when the OTP low power circuit is in the programmable mode.

5. The method of claim 1, further comprising:
assigning, by the combinational logic controller, a valid address to the read lines for a read operation during the read mode; and
assigning, by the combinational logic controller, a valid address and a data for a program operation during the programmable mode.

6. A one time programmable (OTP) low power circuit comprising:
a single regulator configured to output a first bias voltage;
a Bitcell comprising programmable word lines and read lines, wherein the programmable word lines and the read lines are configured to operate in a programmable mode or a read mode;
a diode drop configured to receive the first bias voltage from the single regulator and to provide a second bias voltage to drive the read lines;
a charge pump configured to provide a third bias voltage;
a combinational logic controller configured to control operations of the Bitcell in the programmable mode and read mode;
a program current sink load configured to drain a load current while the programmable word lines and the read lines are driven by the third bias voltage and the first bias voltage, respectively, in the programmable mode; and
a read current sink load that is configured to drain the load current while the programmable word lines and the read lines are driven by the first bias voltage and the second bias voltage, respectively, in the read mode.

7. The OTP low power circuit of claim 6, wherein the charge pump provides a high programming voltage as the third bias voltage to the programmable word lines.

8. The OTP low power circuit of claim 6, wherein a read cycle of a control signal is high when the OTP low power circuit is in the read mode.

9. The OTP low power circuit of claim 6, wherein a program cycle of the control signal is high when the OTP low power circuit is in the programmable mode.

10. A power circuit comprising:
a regulator configured to output a first bias voltage;
a diode drop configured to receive the first bias voltage and output a second bias voltage;
a charge pump configured to output a third bias voltage;
a combined logic controller; and
a one-time-programmable bit cell comprising a read line and a program line and configured to operate in a read mode or a programmable mode, wherein:
when the bit cell is in the read mode, the combined logic controller directs the second bias voltage to the read line and the first bias voltage to the program line, and
when the bit cell is in the programmable mode, the combined logic controller directs the first bias voltage to the read line, and the third bias voltage to the program line.

11. The power circuit of claim 10, further comprising a plurality of one-time-programmable bit cells, each configured to operate in a read mode or a programmable mode.

12. The power circuit of claim 10, wherein the power circuit includes no more than one regulator.

13. The power circuit of claim 10, further comprising a read current sink load and a program current sink load.

14. The power circuit of claim 10, wherein the bit cell is programmed by the third bias voltage through a gate break down process.

* * * * *